(12) United States Patent
Thiesen

(10) Patent No.: US 7,692,366 B2
(45) Date of Patent: Apr. 6, 2010

(54) MINIATURIZED PIEZOELECTRIC BASED VIBRATIONAL ENERGY HARVESTER

(75) Inventor: Jack Thiesen, Plymouth, MI (US)

(73) Assignee: Michelin Recherche Et Technique S.A., Granges-Paccot (CH)

( * ) Notice: Subject to any disclaimer, the term of this patent is extended or adjusted under 35 U.S.C. 154(b) by 0 days.

(21) Appl. No.: 11/628,519

(22) PCT Filed: Jul. 27, 2005

(86) PCT No.: PCT/US2005/026551

§ 371 (c)(1),
(2), (4) Date: Dec. 17, 2007

(87) PCT Pub. No.: WO2006/046989

PCT Pub. Date: May 4, 2006

(65) Prior Publication Data

US 2008/0136292 A1 Jun. 12, 2008

Related U.S. Application Data

(63) Continuation-in-part of application No. PCT/US2004/034701, filed on Oct. 21, 2004.

(51) Int. Cl.
*H01L 41/113* (2006.01)
(52) U.S. Cl. .................................... 310/339
(58) Field of Classification Search ............. 310/339
See application file for complete search history.

(56) References Cited

U.S. PATENT DOCUMENTS

| | | | |
|---|---|---|---|
| 2,880,333 A | 3/1959 | Dranetz | |
| 3,311,761 A | 3/1967 | Schloss | |
| 3,760,351 A | 9/1973 | Thomas | |
| 4,061,200 A | 12/1977 | Thompson | |
| 4,387,318 A * | 6/1983 | Kolm et al. | ............... 310/330 |
| 4,510,484 A | 4/1985 | Snyder | |
| 4,862,486 A | 8/1989 | Wing et al. | |
| 4,972,713 A | 11/1990 | Iwata | |
| 5,118,981 A | 6/1992 | Kobayashi et al. | |
| 5,457,447 A | 10/1995 | Ghaem et al. | |
| 5,749,984 A | 5/1998 | Frey et al. | |
| 5,869,189 A | 2/1999 | Hagood, IV et al. | |

(Continued)

FOREIGN PATENT DOCUMENTS

EP 1 528 609 A 5/2008

(Continued)

OTHER PUBLICATIONS

European Search Report for EP 05775599.3; PCT/US2005/026551, Sep. 4, 2008.

(Continued)

*Primary Examiner*—Thomas M Dougherty
(74) *Attorney, Agent, or Firm*—Dority & Manning, P.A.

(57) ABSTRACT

The present subject matter discloses apparatus and methodologies for fabricating apparatus for harvesting power from environmentally induced vibrations. Piezoelectric devices and structures (1600) are disclosed that employ constant force spring or flexure arrangements (1512) in balanced opposition configurations (1510, 1534) to enhance the power harvesting capabilities of the piezoelectric devices (1600). Power harvesting devices and systems in accordance with the subject technology may concurrently operate as sensors in motion sensitive applications thus providing self-powered monitoring capabilities.

14 Claims, 12 Drawing Sheets

U.S. PATENT DOCUMENTS

| | | | |
|---|---|---|---|
| 6,048,622 | A | 4/2000 | Hagood, IV et al. |
| 6,252,336 | B1 | 6/2001 | Hall |
| 6,407,484 | B1 | 6/2002 | Oliver et al. |
| 2003/0006668 | A1 | 1/2003 | Lal et al. |
| 2004/0075367 | A1* | 4/2004 | Rado .......................... 310/339 |
| 2005/0093398 | A1 | 5/2005 | Kim et al. |
| 2006/0175937 | A1* | 8/2006 | Clingman et al. ........... 310/339 |
| 2007/0145861 | A1* | 6/2007 | Tanner ....................... 310/339 |

FOREIGN PATENT DOCUMENTS

| | | |
|---|---|---|
| FR | 2 838 885 A | 10/2003 |
| JP | 2003-218418 A | 7/2003 |
| JP | 2005-045988 A | 2/2005 |

OTHER PUBLICATIONS

Supplemental European Search Report for EP 04795811.1-2222 dated Apr. 22, 2009.

* cited by examiner

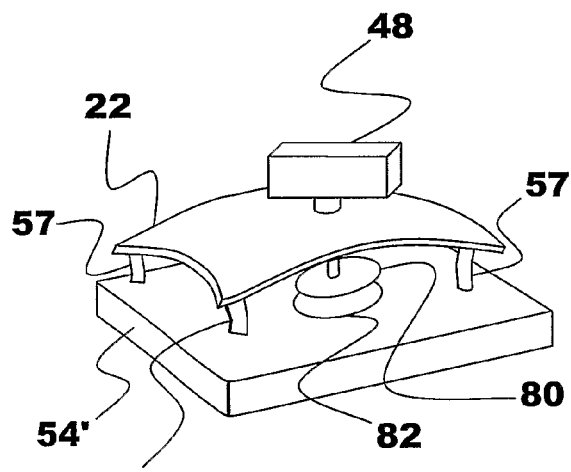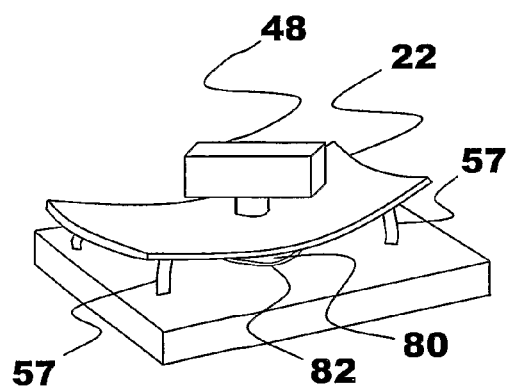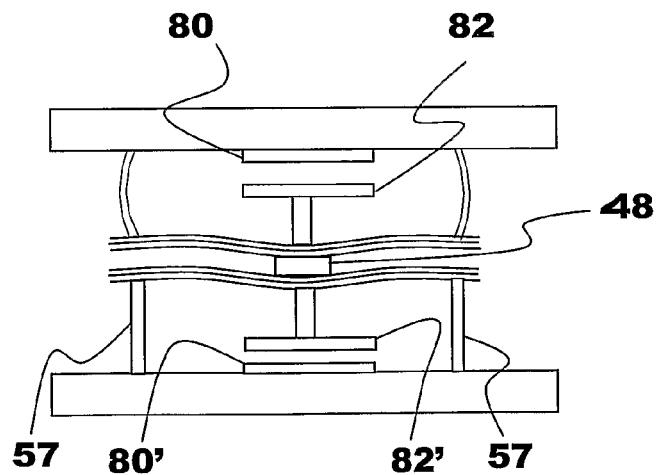
Fig. 3(a) Fig. 3(b)
Fig. 3(c)

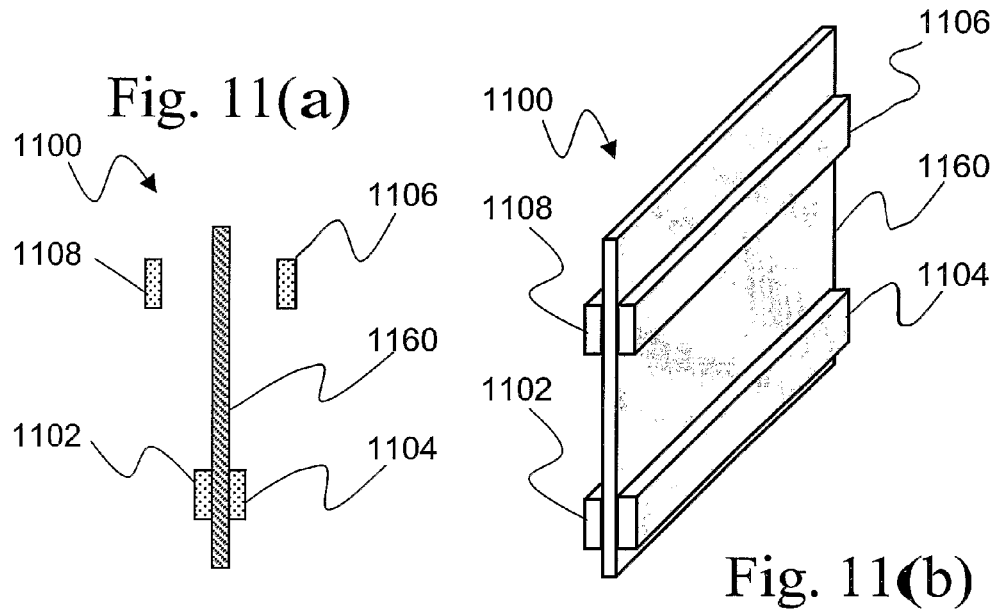
Fig. 11(a)
Fig. 11(b)
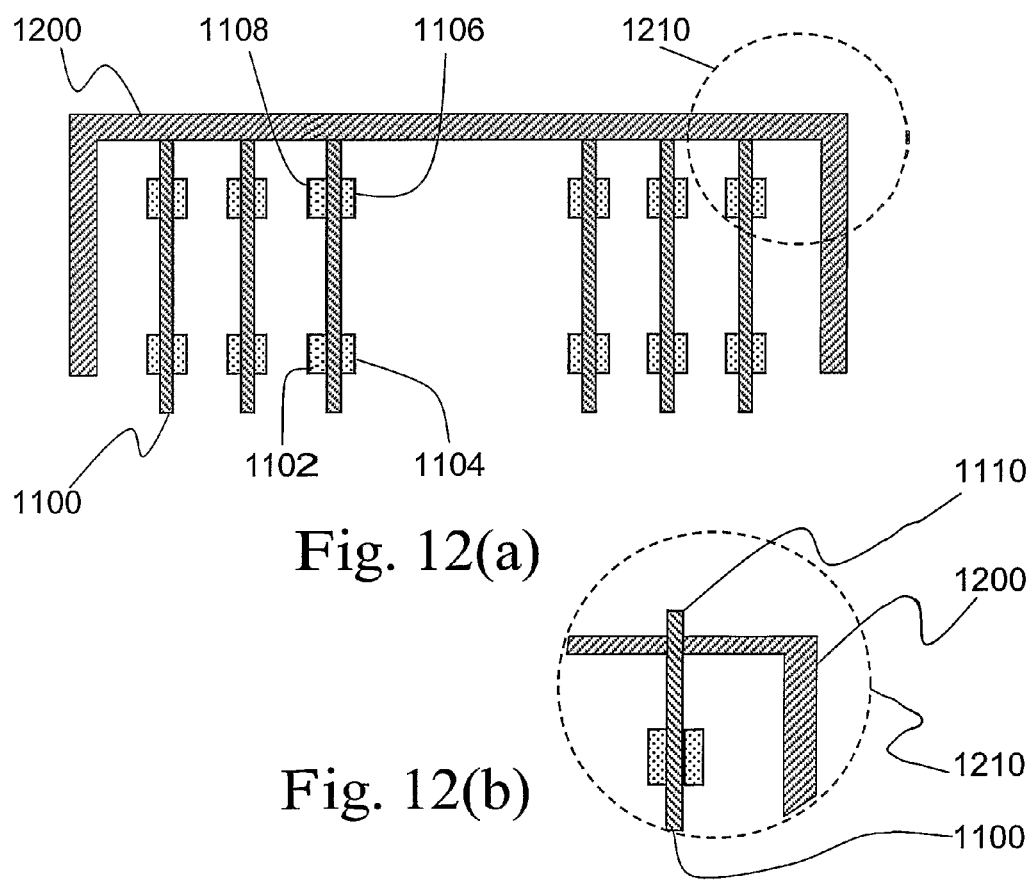
Fig. 12(a)
Fig. 12(b)

MINIATURIZED PIEZOELECTRIC BASED VIBRATIONAL ENERGY HARVESTER

PRIORITY CLAIM

This application is a Continuation-In-Part of previously filed PCT Patent Application entitled "A MINIATURIZED PIEZOELECTRIC BASED VIBRATIONAL ENERGY HARVESTER," assigned PCT/US 04/34701, filed on Oct. 21, 2004, which is incorporated herein by reference for all purposes.

FIELD OF THE INVENTION

The present invention generally concerns a compact, miniaturized apparatus and corresponding methodology for harvesting energy generated by a piezoelectric structure exposed to mechanical energy and vibration of host structures as well as methodologies for making piezoelectric energy harvesting apparatus. Host structures may correspond to virtually any physical apparatus but the present technology is particularly well suited for integration with sensor applications.

BACKGROUND OF THE INVENTION

In many sensor applications, there is a need for power to operate associated electrical components yet it is often inconvenient, due to maintenance issues, or impossible due to space and mass limitations, to provide this power by conventional means such as batteries or combustion processes. In this light it would be advantageous to be able to realize a compact miniaturized power harvesting systems that could glean ambient power, i.e. power stored in local vibrations, and convert this into useful electricity. It would also be advantageous if the same technology that generated the power could be used as a sensor since such could greatly simplify the sensor design and reduce the overall package size.

Applications for such technology might include a remotely distributed after-market sensor suite that could be employed on a vibrating machine to provide self-powered sensors for sensing as well as communications via RF transmission with power for the transmission coming from conversion of vibrations to power. Such an arrangement would be very convenient from an installation and maintenance point of view. Structural health monitoring using a distributed sensor network that is not only independently powered but which can also independently report, if conditions should warrant, could be possible by employing such technology.

A power-harvesting device of this type could also be used in geophysical prospecting or as an alarm/data recorder for natural geophysical events. In the prospecting case, the vibrational energy from an energy source such as a vibrator could be converted to electrical energy and used to power RF transmission of data. This would simplify the distribution of seismic recording devices since it would remove the need for cabling. Such a system could also include a GPS receiver so that the step of surveying could also be eliminated from geophone placement during land surveys. Power to operate the device could also come from the vibrations associated with physically carrying the device and deploying it on the survey site as well as the energy generated from seismic waves. In the case of geophysical event monitoring, an array of geophones could be placed remotely around a likely event epicenter and begin transmitting information at the occurrence of an event. By eliminating batteries from the transmission system, these sensors can be made inexpensively.

Such a system could also be used as an alarm in military or security applications where the generated power from the vibration of military or other vehicles could wake up the sensor and allow for a warning transmission. Such devices could also be used to power pacemakers or other invasive health monitoring or health support systems where power could be generated from the motion of the wearer. In all of these applications, a study of the vibrational spectrum and/or waveform could also be used to provide information about the health of the system or to identify a particular event or even a particular vehicle.

Another potential application concerns tires and sensors for tires. In many in-tire sensor suits there is a recognized need for continuous data transmission. This need arises for safety and performance reasons. For example, while temperature and pressure may change slowly during the course of normal operation, one of the real benefits of in-tire temperature and pressure monitoring is to alert the driver to potential catastrophic failures before they occur. Such failure events can develop very rapidly at high speeds; hence a need exists for more continuous monitoring. U.S. Pat. No. 5,749,984 (Frey et al.) discloses a tire monitoring system and method that is capable of determining such information as tire deflection, tire speed, and number of tire revolutions. Another example of a tire electronics system can be found in U.S. Pat. No. 4,510,484 (Snyder), which concerns an abnormal tire condition warning system. U.S. Pat. No. 4,862,486 (Wing et al.) also relates to tire electronics, and more particularly discloses an exemplary revolution counter for use in conjunction with automotive and truck tires.

Further there is a recognized benefit in allowing vehicle tires to act as real-time sensors that interact with a number of vehicle control systems, such as anti-lock braking systems (ABS), steering, and traction control. In such applications it is critical that information be transmitted continuously and with minimum temporal bias to the relevant control system. Such requirements force the consideration of continuous data transmission and methods of powering continuous data transmission devices. A typical solution for powering tire electronics systems corresponds to the use of a non-rechargeable battery, which inherently provides an inconvenience to the tire user since proper electronics system operation is dependent on periodic battery replacement. Conventional batteries also often contain heavy metals that are not environmentally friendly and which present disposal concerns, especially when employed in significant quantities. Still further, batteries tend to deplete their energy storage quite rapidly when powering electronic applications characterized by complex levels of functionality. Battery storage depletion is especially prevalent in electronic systems that transmit information over a relatively far distance such as from truck wheel locations to a receiver in the truck cabin. In such considerations, it is readily apparent that batteries are undesirable for many reasons. Therefore it would be a major advance in the art to find a means of scavenging power from vibration and deformation sources intrinsic to the tire.

Yet another potential capability offered by electronics systems integrated with tire structures corresponds to asset tracking and performance characterization for commercial vehicular applications. Commercial truck fleets, aviation crafts and earthmover/mining vehicles are all viable industries that could utilize the benefits of self-powered tire electronic systems and related information transmission. Self-powered sensors could determine the distance each tire in a vehicle has traveled and thus aid in maintenance planning for such commercial systems. Vehicle location and performance can be optimized for more expensive applications such as those concerning earth-mining equipment. Entire fleets of vehicles could be tracked using RF tag transmission, exemplary aspects of which are disclosed in U.S. Pat. No. 5,457,447 (Ghaem et al.).

Such integrated tire electronics systems have conventionally been powered by a variety of techniques and different power generation systems. Examples of mechanical features for generating energy from tire movement are disclosed in U.S. Pat. No. 4,061,200 (Thompson) and U.S. Pat. No. 3,760,351 (Thomas). Such examples provide bulky complex systems that are generally not preferred for incorporation with modern tire applications. Yet another option for powering tire electronics systems is disclosed in U.S. Pat. No. 4,510,484 (Snyder), which concerns a piezoelectric reed power supply symmetrically configured about a radiating centerline of a tire.

It is appreciated that certain advantages of piezoelectric materials have long been recognized. However, such technology is constantly improving, thus potentially affording applications that utilize piezoelectric materials with improved operating capabilities. Examples of relatively new advances in piezoelectric technology are provided in U.S. Pat. Nos. 5,869,189 (Hagood, IV et al.) and 6,048,622 (Hagood, IV et al.), directed to composites for structural control. The presently disclosed technology concerns further advances in piezoelectric technology such that a piezoelectric power generating device can be miniaturized for purposes of energy harvesting and, in certain circumstances concurrently function as sensors and together can be integrated with virtually any vibration generating device or structure to provide self-powered systems and devices.

The disclosures of all of the foregoing United States patents are hereby fully incorporated into this application for all purposes by reference thereto. While various power generation systems have been developed, no design has emerged that generally encompasses all of the desired characteristics as hereafter presented in accordance with the subject technology.

BRIEF SUMMARY OF THE INVENTION

In view of the recognized features encountered in the prior art and addressed by the present subject matter, improved devices, device construction methodologies, systems and methodologies for harvesting vibrational energy have been developed. Piezoelectric technology is utilized to convert mechanical stress and strain associated with mechanical induced vibration to electric charge that may then be harvested to provide operating power for a host of various devices.

In accordance with certain aspects of the disclosed technology, miniaturized devices, systems and methodologies for manufacturing such devices that are capable of generating power from vibrational energy sources intrinsic to the environment in which the device may be employed are provided. Devices according to the present technology can be manufactured in a compact form and can be scaled from meso-scale to micro-scale. Methodologies for manufacture of the devices of the present technology include precision micro machining and casting. Micro machining offers the prospect of providing a device that is miniaturized to the point that a power generator may be packaged in such a way that it permits ready attachment to a packaged integrated circuit. It may even be possible to fit a monolithic power harvesting device and conditioning circuitry directly onto the die of an integrated circuit.

In accordance with more particular aspects of the disclosed technology, one aspect of the present subject matter is to provide self-powered electronic components. Such electronic components are self-powered by energy harvested from integrated piezoelectric structures and may correspond with numerous electronic applications. One exemplary electronic application concerns a tire monitoring system designed to measure and transmit information regarding tire conditions such as pressure and temperature, as well as other information such as the number of tire revolutions or general tire identification information and variables.

Another aspect of certain exemplary electronic applications of the present technology concerns geophysical monitoring systems designed to monitor and/or measure ground vibrations induced from naturally occurring events or as might be induced from the movement of vehicles or other machinery. Such applications might relate to the provision of self-powered monitoring devices designed to monitor ground vibrations induced by earthquakes, volcanic activity, or other naturally occurring geologic events. Applications may also relate to the provision of self-powered monitoring devices for the detection of ground and other vibration induced by vehicles, machines, or living entities with respect to protective, safety, or military concerns.

Yet another exemplary application of the present technology concerns self-powered patient worn or implanted medical devices. Self-powered pacemakers and health monitoring devices may be powered by harvesting energy generated from the motion of the patient/wearer.

Various features and other aspects of the subject electronics system and specialized power-generating device of the present technology offer a plurality of advantages. The disclosed technology provides for a self-powered electronics system that is not dependent on replacement of batteries. Although batteries and battery-operated devices may still be incorporated with aspects of the present subject matter, many complications regarding electronic devices that are solely powered by batteries are obviated in accordance with the present technology.

Yet another aspect of the present subject matter is that there are fewer limitations regarding the type and amount of electronic equipment capable of being operated by power sources provided by the present technology. Electronics powered by conventional methods rather than as in accordance with the disclosed piezoelectric technology are often limited to ultra-low power devices. Devices in accordance with the presently disclosed technology are not necessarily subject to such extreme power limitations. This aspect of the presently disclosed technology further facilitates greater functionality of self-powered electronics, as more components and/or higher-level equipment may potentially be utilized.

A still further aspect of the present subject matter is that the disclosed system and method for generating power and utilizing such power can be used in accordance with a variety of existing applications. Measurement capabilities, monitoring and warning systems, vehicle feedback systems, and asset tracking potential may be possible for applications such as commercial truck fleets, airplanes, and mining/earthmover equipment.

In one exemplary embodiment of the present subject matter, a piezoelectric based vibrational energy harvester is formed by a pair of piezoelectric unimorphs arranged in opposition to each other, individually doubly bonded to opposing beams and sharing a common proof mass.

In another exemplary embodiment of the present subject matter, a piezoelectric based vibrational energy harvester is formed by bonding a plurality of networked unimorphs on each side of a shared proof mass. This configuration provides more stability for the proof mass and, at the same time, doubles the amount of collected vibrational energy harvested.

In yet another exemplary embodiment of the present subject matter, energy can be efficiently harvested from typical longitudinal and transverse vibrations by breaking the resonance of the device resulting in increased harvested energy over that that may be obtained from resonant structures.

Other embodiments of the present subject matter correspond to methodologies for enhanced energy harvesting through the incorporation of motion sensitive electrical components with the basic piezoelectric based vibrational energy harvester. Such motion sensitive electrical components may include capacitors, magneto-inductive devices, and piezoelectric devices.

Yet other embodiments of the present subject matter correspond to methodologies for coupling energy through the use of mechanical, electronic or electromagnetic springs using a double acting technique.

Yet further embodiments of the preset subject matter correspond to methodologies and apparatus for enhancing energy harvesting through the incorporation of constant force springs. Arrangements including constant force springs provide balanced inertial mass configurations resulting in the formation of broadband energy acceptors.

Yet still further embodiments of the present subject matter correspond to methodologies for improving energy recovery and preventing device lockout by providing regenerative motion stop elements within the support frame structure or by the design of the flexures themselves.

Finally, still other embodiments of the present technology correspond to methodologies for embodying the present technology in a planar form suitable for fabrication using micromachining techniques, photolithographic techniques, exfoliation processes, and wafer bonding techniques.

Additional aspects and advantages of the present subject matter are set forth in, or will be apparent to, those of ordinary skill in the art from the detailed description herein. Also, it should be further appreciated that modifications and variations to the specifically illustrated, referred and discussed features and steps hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in this summarized section, may include and incorporate various combinations of aspects of features, components, or steps referenced in the summarized objectives above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIGS. 3(a) and 3(b) are respectively representations of relaxed and strained structural relationships of a double clamped plate shaped piezoelectric unimorph arrangement illustrating operational characteristics of the present technology and including capacitive elements for improved energy harvesting;

FIG. 3(c) illustrates a third exemplary double acting energy harvester system employing piezoelectric and capacitive elements in accordance with the present technology;

FIGS. 11(a), 12(a), and 13-16 illustrates exemplary sequential steps in the construction of a miniature power generator in accordance with the present technology;

FIG. 11(b) illustrates an isometric view of an exemplary spring and attached piezoelectric elements in accordance with the present technology; and FIG. 12(b) illustrates an alternate mounting arrangement of constant force springs within a support frame.

Figure 1A:
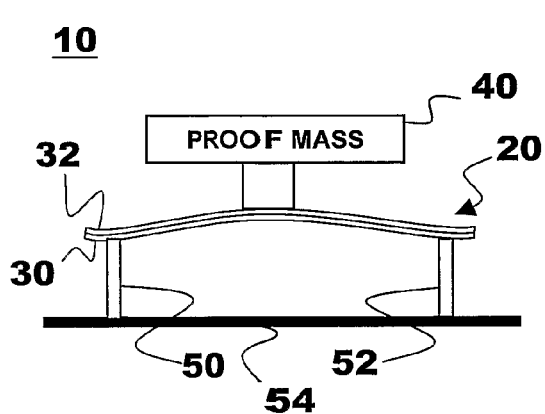
FIGS. 1(a) and 1(b) are respectively representations of relaxed and strained structural relationships of a double clamped piezoelectric unimorph arrangement illustrating operational characteristics of the present subject matter.

Repeat use of reference characters throughout the present specification and appended drawings is intended to represent same or analogous features or elements of the invention.

DETAILED DESCRIPTION OF THE PREFERRED EMBODIMENTS

As discussed in the Brief Summary of the Invention section, the present subject matter particularly concerns improved apparatus, systems, methods of manufacture, and methodologies for harvesting energy produced by mechanical vibrations using piezoelectric devices to provide operating power for various electronic systems.

Figure 1B:
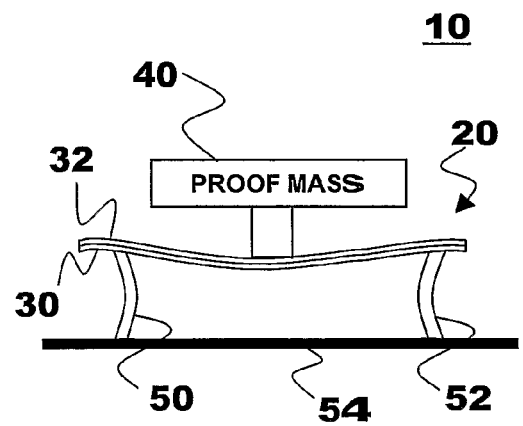
Figure 1C:
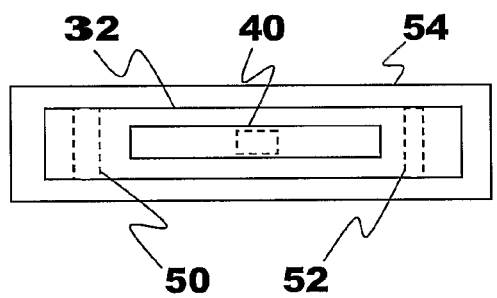
FIG. 1(c) is a plan view representation of the structure illustrated in FIGS. 1(a) and 1(b)

With reference to FIGS. 1(a), 1(b), and 1(c), there is illustrated a basic configuration of a first exemplary embodiment of a power harvester 10 in accordance with the present subject matter. Illustrated is a doubly clamped piezoelectric unimorph 20 corresponding to a layer of piezoelectric material 32 bonded to a spring 30 with the combination supported by a pair of support springs 50, 52 associated with a support structure 54 that may be a ceramic wafer. Piezoelectric material 32 is illustrated as being co-extensive with spring 30, however such is not required as piezoelectric material 32 may correspond to a lesser area than presently illustrated. Piezoelectric material 32, as well as all of the other piezoelectric materials described herein, may correspond to a piezoelectric single crystal, lead zirconate titanate (PZT), lead lanthanum zirconate titanate (PZLT), Barium Titanate ($BaTiO_3$), Polyvinylidene Fluoride (PVDF), or other materials with piezoelectric properties. Spring 30, as well as all of the other spring or flexure materials described herein corresponds to a non-piezoelectric material and may include such materials as brass, Ni, NiTi alloys, spring steel, FeNi alloys, carbon fiber materials, shape memory alloys (SMAs), and others. It should be clearly understood that the exact formulation of the components of a piezoelectric unimorph usable with the present technology is not a limiting factor to the present subject matter but rather the present subject matter is primarily concerned with various arrangements of such piezoelectric unimorphs as they relate to power harvesting configurations. It should be further noted that, for purposes of the present disclosure, the terms "piezoelectric unimorph" and "unimorph" are consider synonymous, as are also the terms "piezoelectric bimorph" and "bimorph" and the terms "spring" and "flexure."

With continued reference to FIG. 1(a), a relaxed state of power harvester 10 is illustrated while FIG. 1(b) illustrates the power harvester 10 in its deflected or strained state, a condition arising from induced vibrational forces imparted to the proof mass 40 and hence to the piezoelectric unimorph. In its relaxed state, each of the components of power harvester 10 adopts a neutral state. Support springs 50, 52 are straight, creating no force an the supported spring 30, while support spring 30 adopts a straight or, as illustrated, slightly curved neutral force position.

When the power harvester 10 is strained as illustrated in FIG. 1(b), the strain induces separation of charge in the piezoelectric unimorph 20 in a manner well known to those of ordinary skill in the art of piezoelectric device fabrication and design. In addition support springs 50, 52 as well as spring 30 are flexed as a result of the force applied by proof mass 40 into positions in which they tend to generate a restoring force attempting to return the system to the relaxed position illustrated in FIG. 1(a). Continued externally induced vibration tends to cause the system to alternate between the relaxed position of FIG. 1(a) and the strained position of FIG. 1(b) thus producing strain on piezoelectric element 32 and, consequent, energy production.

Piezoelectric unimorph 20 may correspond to a single crystal unimorph or may be fabricated using the oxide reduction techniques of the 1993 "RAINBOW" teachings originating from Clemson University, Clemson, S.C. which fabrications techniques were described in the article "Rainbow Ceramics: Processing Techniques; Piezoelectric, Dielectric and Pyroelectric Properties; and Polarization Distributions as Determined with SLIMM" by Lang and Li, Journal of the Korean Physical Society, Vol. 32, February 1998 which is hereby incorporated for all purposes.

Figure 1D:
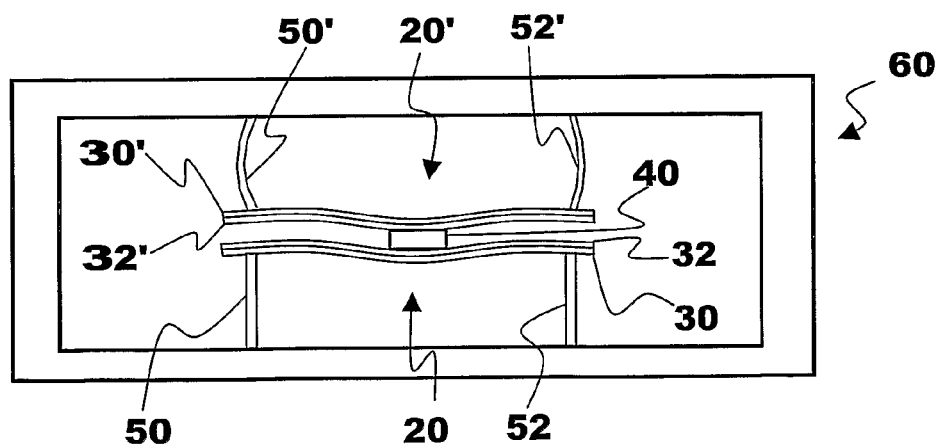
FIG. 1(d) illustrates a first exemplary embodiment of a double acting energy harvester in accordance with the present technology.

FIG. 1(d) illustrates a first exemplary embodiment of a double acting power harvester 60 in accordance with the present technology. Double acting energy harvester 60 combines attributes of the relaxed and strained structural relationships illustrated in FIGS. 1(a) and 1(b). More particularly, the double acting power harvester 60 illustrated in FIG. 1(d) couples together, by way of a common proof mass 40, two power harvesters 20, 20', one of which may be in a relaxed condition while the other is in a strained condition. Power harvesters 20, 20' are respectively supported by support springs 50, 52 and 50', 52' in mechanical opposition to each other in a configuration that doubles the amount of harvested energy.

A significant aspect of the present subject matter relates to a concept that may be described as "balanced opposition." Power harvesters 20, 20' are coupled to a common proof mass 40 such that the forces placed on the common proof mass 40 by the power harvester pairs are substantially equal when the proof mass is at the midpoint of its travel. A slight imbalance is illustrated in FIG. 1(d), where a small amount of strain is shown in the slightly curved support springs 50', 52', of energy harvester 20' while support springs 50, 52 of the opposed energy harvester 20 are relaxed as illustrated by their straight configuration.

One benefit of a balanced arrangement is that a small and unsteady vibration following an environmentally induced impulse can be used to generate a nearly continuous stream of energy. Such an arrangement can be used with great utility with all of the embodiments described herein, particularly if the energy harvester is designed to operate at or near the dominant resonance of the system from which it will be converting parasitic vibrational energy into electrical energy. Employing low spring constant support structures that contribute to a wide band energy harvesting capability for the system may further enhance such design.

Figure 2A:
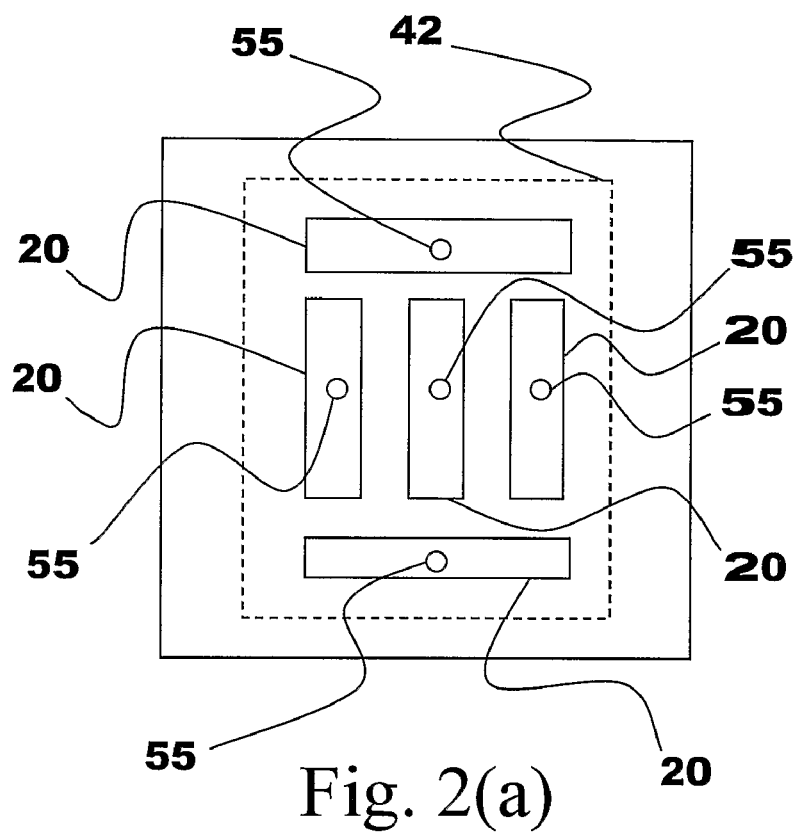
FIG. 2(a) illustrates a plan view of an exemplary networked arrangement of a plurality of piezoelectric unimorphs in accordance with the present subject matter.
Figure 2B:
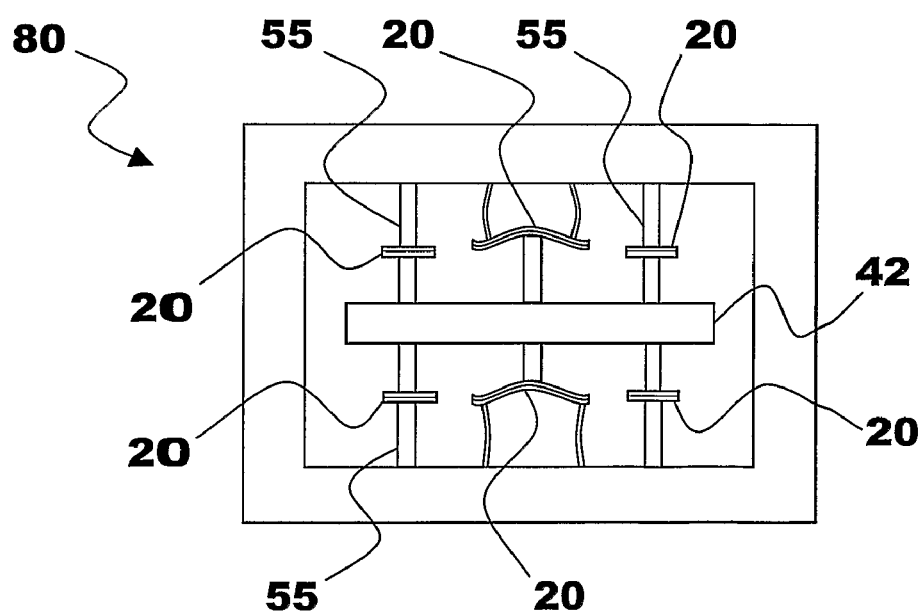
FIG. 2(b) illustrates a side elevation of the networked arrangement illustrated in FIG. 2(a)

FIG. 2(a) is a plan view and FIG. 2(b) is a side elevation of a second embodiment of a power harvester in accordance with the present subject matter wherein a plurality of networked piezoelectric unimorphs 20 are coupled to a common proof mass 42 by way of support elements 55. Such a networked configuration of a plurality of unimorphs provides not only a significantly higher energy harvesting capability but also improved mechanical stability of the proof mass 42 and greater system design flexibility.

The embodiment of the present subject matter illustrated in FIG. 2(b) represents a double acting system similar to the embodiment of FIG. 1(d). Another important aspect of the FIG. 2(b) embodiment, however, is that the two sets of unimorphs are positioned on either side of the proof mass 42 in such a manner that the unimorphs are placed into a balanced opposition, that is with nearly equally forces, when the proof mass 42 is at the midpoint of its travel. As with the embodiment of the present technology illustrated in FIG. 1(d), this embodiment also operates under a balanced condition, such that a small and unsteady vibration following an impulse can be used to generate a nearly continuous stream of energy.

Following an impulse that is large enough to create a deflection in one of the unimorphs 20, there is created a loaded spring effect in one of the sets of opposed unimorphs that will act to drive the proof mass 42 and deflect the unimorphs constituting the opposed set of unimorphs. Because of the nearly balanced condition of the system, only enough additional vibrational energy to overcome proof mass inertia need to be available to keep such a system oscillating. This form of power harvester according to the present subject matter is particularly advantageous in that the arrangement can be designed to operate at or near the dominant resonance of the system from which the power harvester 80 will be converting parasitic vibrational energy into electrical energy. Further, by providing low spring constant supports, a wide band energy harvesting capability is provided.

A further embodiment of the present subject matter will now be described with reference to FIGS. 3(*a*), 3(*b*), and 3(*c*). More specifically, as previously mentioned, one mechanism for harvesting energy from environmentally induced vibrations through operation of devices and systems in accordance with the present subject matter involves the strain induced separation of charge within the piezoelectric materials that correspond to the active portions of the unimorph structures. It has been found that additional energy may be harvested using capacitive effects. More to the point, in the configurations illustrates in FIGS. 3(*a*), 3(*b*), and 3(*c*), one or more capacitive electrodes 80, 82 are provided and, as illustrated, are coupled to one or more plate shaped unimorphs and the unimorph support structure in such a manner that the electrodes forming individual capacitors move with respect to one another with the movement of the plate shaped unimorphs.

Although the unimorphs illustrated in FIGS. 3(*a*), 3(*b*), and 3(*c*) are shown as plate shaped unimorphs, it should be appreciated that the unimorphs 22 may, never the less, be embodied in other configurations. For example, in addition to the plate shaped configuration illustrated, the unimorphs may be embodied as beam shaped unimorphs as in the previous embodiments with the piezoelectric portions thereof co-extensive or less so than the support or as disk shaped unimorphs.

With specific reference to FIGS. 3(*a*) and 3(*b*) the operational concept of the embodiment of the present technology shown in FIG. 3(*c*) will be further explained. As illustrated in FIGS. 3(*a*) and 3(*b*), a plate shaped unimorph 22 is illustrated attached to a support structure 54' by way of supporting spring elements 57. As previously noted with respect to the embodiment illustrated in FIGS. 1(*a*)-1(*d*), support structure 54' may be a ceramic wafer or any other suitable support structure. Coupled to one surface of unimorph 22 is a proof mass 48 while one electrode 80 of a capacitor is coupled to the other side of the unimorph 22. A second electrode 82 of the capacitor is attached to support structure 54'. As illustrated in FIGS. 3(*a*) and 3(*b*), as the unimorph 22 is flexed under the influence of proof mass 48, capacitor electrodes 80 and 82 are moved relative to one another.

In this configuration, when charge is separated as the piezoelectric material is strained, the charge is transferred to the opposite electrode of the capacitor. When the strained unimorph relaxes, any excess energy in the relaxing unimorph may pull the capacitor electrodes apart increasing the energy of the stored charge. With appropriate conditioning circuitry coupled to the unimorph and capacitor combination, the combined device can be used to generate charge and, at the same time, increase its energy by extracting additional energy when the plates 80, 82 forming a charged capacitor are forcefully separated with movement of the unimorph.

FIG. 3(*c*) illustrates an exemplary embodiment of a double acting configuration of the present subject matter employing a plate shaped unimorph reflective of the embodiments of the present subject matter illustrated in FIGS. 1(*d*) and 2(*b*) but including capacitive elements 80, 82, 80', and 82' that correspond directly to the functionally equivalent elements previously described with respect to FIGS. 3(*a*) and 3(*b*). Positive aspects flowing from the double acting configurations previously discussed with respect to FIGS. 1(*d*) and 2(*b*) also flow from the exemplary embodiment of the present subject matter illustrated in FIG. 3(*c*) with the added enhancement of additional energy harvesting capability due to the addition of the capacitive elements.

It should be noted here that the capacitive elements are able, in part, to assist in the harvesting of additional energy due to their motion sensitive operational characteristic. One of ordinary skill in the art may easily realize, however, that other types of motion sensitive elements may be used. For example, the capacitor plates could be replaced by a coil and magnet arrangement configure such that movement of the proof mass relative to a support structure would result in a permanent magnet moving in and out of a coil. Such movement could clearly be employed to harvest additional energy. In like manner, an additional piezoelectric element could be mounted between the moving proof mass and a fixed support structure so as to permit flexure of the piezoelectric element as the proof mass moves. Again additional energy may be harvested through such a configuration.

Figure 4A:
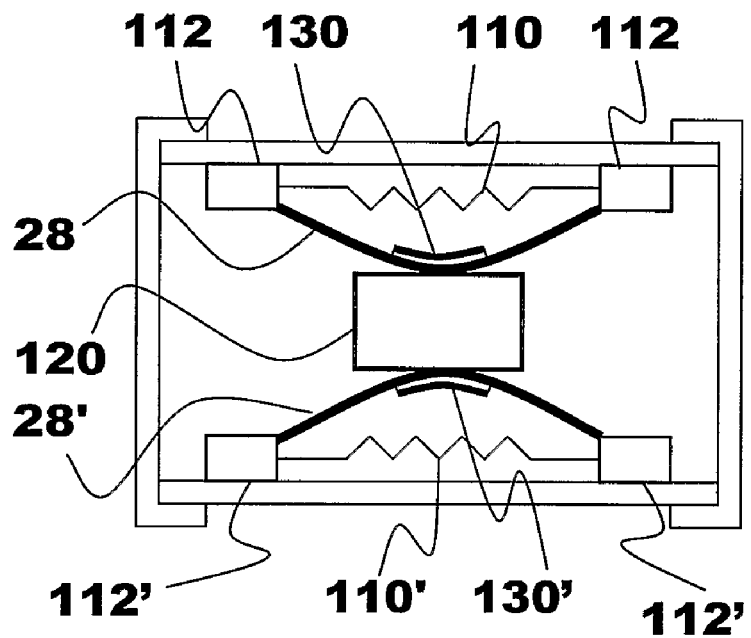
FIGS. 4(a) and 4(b) illustrate a fourth exemplary embodiment of a double acting energy harvester in accordance with the present technology and employing a spring effect to accommodate the acceleration of a proof mass
Figure 4B:
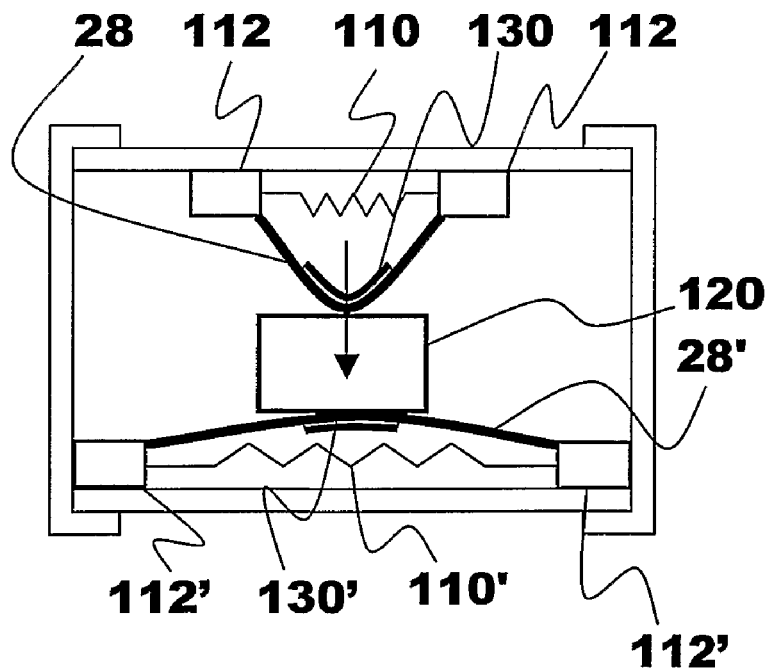

FIGS. 4(*a*) and 4(*b*) illustrate another exemplary embodiment of the present subject matter that is similar to previously presented embodiments in that these embodiments are also double acting, but differ from the standpoint that the piezoelectric unimorphs are configured to translate between differing degrees of curved flexure rather than translating back and forth between concave and convex forms as most readily seen by comparing previously described FIGS. 1(*a*), 1(*b*), 3(*a*) and 3(*b*) with presently illustrated FIGS. 4(*a*) and 4(*b*). The embodiment of the present subject matter illustrated in FIGS. 4(*a*) and 4(*b*) employs paired springs 28, 28', both biased to tend to become flat, and on which a pair of piezoelectric devices 130, 130', respectively, are mounted thereby forming an opposed pair of unimorphs, that is, a bimorph. The thusly-formed pair of opposed unimorphs are commonly coupled at central points thereof to a proof mass 120. The extremities of each of the springs 28, 28' are mounted on sliding supports 112, 112' to which also a pair of springs 110, 110' are coupled.

As illustrated in FIG. 4(*a*), springs 110, 110' are biased to pull the ends of springs 28, 28' towards each other so that the entire system consisting of springs 28, 28' and springs 100, 100' are balanced such that the commonly coupled proof mass 120 assumes a central, neutral state. Upon occurrence of externally induced vibration, proof mass 120 may move in the direction of the illustrated arrow such that spring 28' is allowed to move into a preferred extend (more nearly flat) position, while spring 28 is forced to a more compressed posture as illustrated. As springs 28, 28' flex, the attached piezoelectric devices 130, 130' are simultaneously flexed and thus produce energy that may be harvested via appropriate electrical circuitry (not shown). One aspect of such a design is that the spring 28, 28' on which the piezoelectric device 130, 130' is mounted no longer solely determines the mechanical response of the device. Another aspect of this configuration comes from the understanding that the springs 110, 110' used to balance the spring forces of springs 28, 28' may be provided as electronic, magnetic, or electromagnetic devices as opposed to the simple mechanical springs illustrated. As with previous embodiments, the "balanced opposition" of dual acting elements coupled with the use of low spring constant springs, provides wide band energy harvesting capabilities.

Figure 5A:
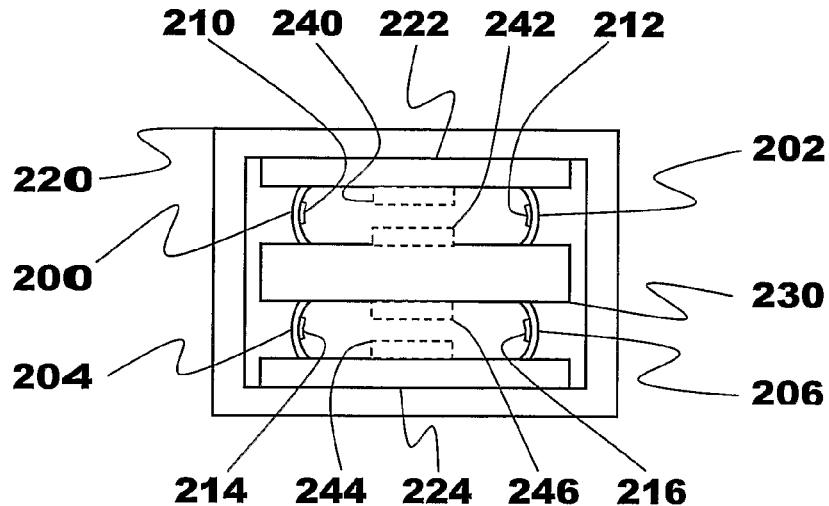
FIGS. 5(a), 5(b), and 5(c) illustrate a fifth exemplary embodiment of a double acting energy harvester with optional capacitive energy harvesting elements.

FIGS. 5(*a*), 5(*b*), and 5(*c*) illustrate yet another embodiment of a dual acting configuration of the present subject matter. In this embodiment, two pairs of springs 200, 202 and 204, 206, each with piezoelectric devices 210, 212, 214, 216, respectively, mounted thereon are configured in a balanced opposition configuration with a shared proof mass 230. As illustrated in FIG. 5(a), each of the springs 200, 202, 204, and 206 are biased, like springs 28, 28' previously discussed with reference to FIGS. 4(a) and 4(b), to tend toward a flat position. As configured, each of the springs 200-206 is slightly compressed as they are mounted between proof mass 230 and respective support elements 222, 224 in association with frame 220.

Figure 5B:
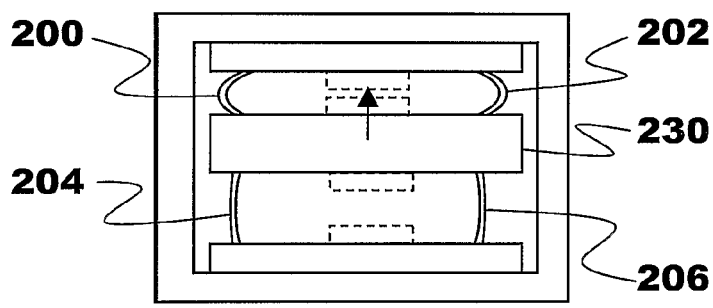
Figure 5C:
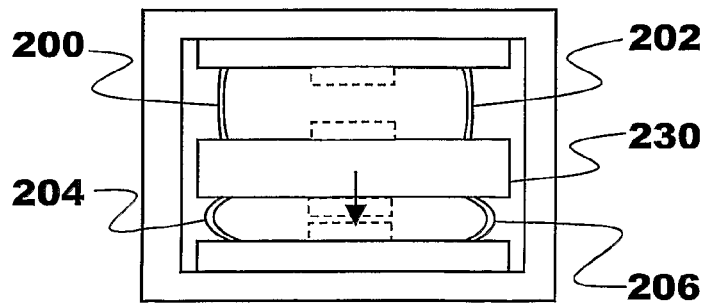

Upon movement of proof mass 230 occasioned by application of externally induced vibrational energy, proof mass 230 will oscillate back and forth as illustrated in FIGS. 5(b) and 5(c), resulting in the alternate compression and release of the spring pairs 200, 202 and 204, 206. Remembering that each of these springs has mounted thereon a piezoelectric device (not illustrated in FIGS. 5(b) and 5(c)), energy may be harvested from the induced vibrations by such piezoelectric devices based on their concurrent flexure with that of their supporting springs and the charge generated by the piezoelectric devices from such flexure. Again, with the addition of appropriate electrical circuitry, such energy may be easily harvested for use as desired.

Also illustrated in FIGS. 5(a)-5(c) is the optional inclusion of electrically conductive elements 240, 242, 244, 246 mounted on support structures 222, 224 and proof mass 230. These elements combine to form capacitors that may be employed in a manner similar to previously discussed embodiments of the present subject matter to assist in harvesting additional energy through forced separation of electrodes in charged capacitors to harvest energy there from.

As previously noted, other types of motion sensitive electrical components may be employed in place of the discussed capacitor element. For example, the electrode plates 242, 246 may be replaced with permanent magnets while the electrode plates 240, 246 are replaced with inductive coils configured such that the permanent magnets move in and out of the inductive coils to generate additional energy. Other configurations of motion sensitive elements may also be envisioned including additional piezoelectric elements configured to flex with the environmentally induced vibration of the proof mass. In addition, as will be discussed more fully later with respect to the embodiment illustrated in FIG. 10, magnetic elements may be employed to assist in the energy harvesting aspects of the present subject matter.

Figure 6A:
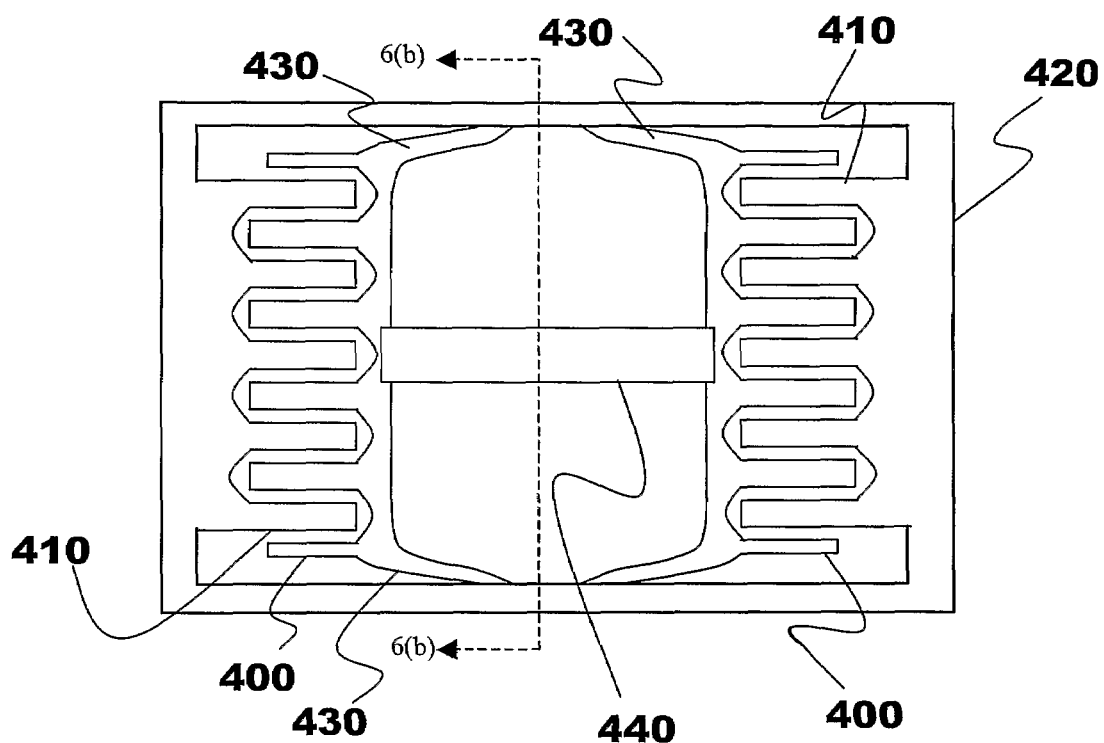
FIGS. 6(a) and 6(b) illustrate plan and cross-sectional views respectively of a sixth exemplary embodiment of the present technology illustrated in a planar configuration suitable for implementation in micro electromechanical systems.
Figure 6B:
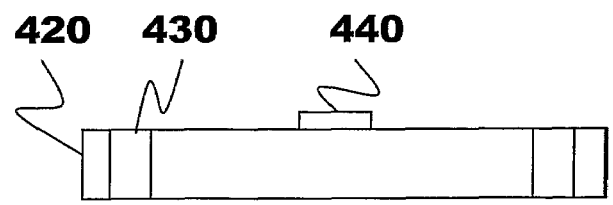

FIGS. 6(a) and 6(b) illustrate respectively plan and cross-sectional views of an exemplary planar embodiment of the present subject matter. In this exemplary embodiment mirrored interdigitated comb structures are designed to create a double acting, "balanced opposition" structure arranged such that one half of each interdigitated comb structure 400 moves under the influence of a proof mass 440 toward and away from a fixed portion 410 of the comb structure that is held in place by frame 420. Support elements 430, affixed to frame 420, support the movable portion 400 of each comb. In addition, proof mass 440 may be provided with a piezoelectric layer to generate charge based on movement of the movable comb element. In this embodiment, the plates of a capacitor formed by the flat surfaces of the comb structures can be used to increase the energy of the charge generated by the piezoelectric layer. Such increase in energy will occur as the springs and/or vibrational energy pulls the plates apart.

One of the problems associated with using many thin-film piezoelectric materials for micro-electromechanical system (MEMS) type applications is the incompatibility of piezoelectric thin-film depositions processes with silicon device processes. Some of these drawbacks include the diffusion of silicon (Si) into the piezoelectric film, which poisons the film reducing or destroying the piezoelectric properties and the high temperatures of deposition required to produce thin-films with acceptable piezoelectric activity, such temperatures being incompatible with the thermal budget of back-end silicon device manufacturing processes.

Other drawbacks of devices based on piezoelectric films for MEMS applications involve etch selectivity and patterning. These issues make the realization of such devices complex and expensive, often requiring the use of exotic material systems and son-standard fabrication processes. Another issue with piezoelectric thin-films is that most deposition techniques produce polycrystalline layers, which have both reduced electrical and mechanical performance as compared to single crystal piezoelectric materials. A final drawback to using piezoelectric thin-films is the fact that the films are typically mechanically fragile. On the other hand, MEMS devices are often designed for rather large strains. Given these considerations, it is advantageous to consider a fabrication methodology that might be able to overcome strain limitations in such devices.

In order to address these problems, the present subject matter discloses a methodology whereby such a device may be realized using standard wet chemical etches, standard photolithographic techniques, standard exfoliation processes, and standard wafer bonding techniques. These techniques also offer the possibility of fabricating mechanically advantageous single or poly-crystal/metal unimorphs with coefficient of thermal expansion (CTE) induced internal stress to mechanically strengthen the piezoelectric layers. The mechanical strengthening of the piezoelectric layers in this way allows them to survive large mechanical deflections.

Figure 7:
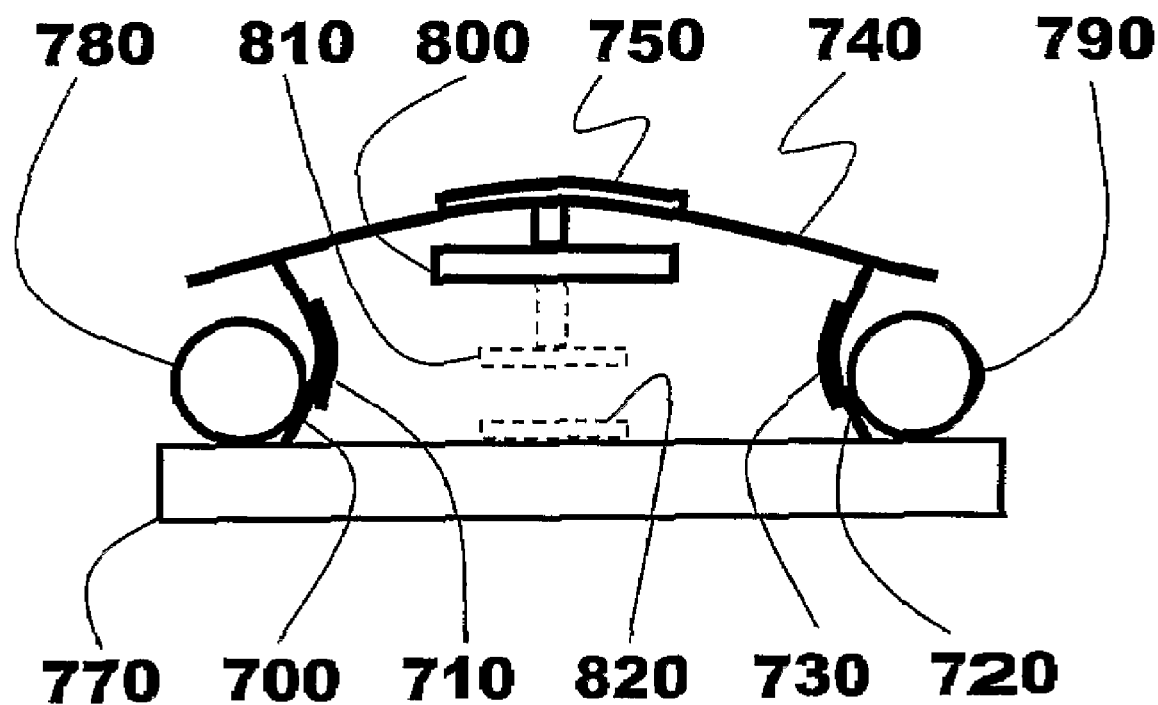
FIG. 7 illustrates a seventh exemplary embodiment of the present technology that also demonstrates a double acting capability.

Referring now to FIG. 7, another double acting embodiment of the present subject matter is illustrated. In the embodiment illustrated in FIG. 7, three unimorphs consisting of springs 700, 720, and 740 each having piezoelectric devices 710, 730, and 750, respectively, secured thereto are illustrated. Springs 700 and 720 are secured at one end and supported by support element 770 while spring 740 is supported by the opposite ends of each of springs 700 and 720. Additional support elements 780, 790 are secured to support 770 in positions adjacent springs 700 and 720, respectively as shown so that the forces generated by springs 700, 720 due to their natural tendency to straighten out will be translated into lateral forces along the length and in the direction of the central portion of spring 740. Absent support structures 780, 790, springs 700, 720 would simply straighten and vertically displace spring 740 further above support element 700. Spring 740, because of its natural tendency to straighten out, provides a balancing force outwardly tending to counter act the inward forces generated by springs 700 and 720.

A proof mass 800 is secured to the under side of spring 740. In this manner, environmentally induced vibrations will tend to force spring 740 down toward support element 770 causing flexure, not only of attached piezoelectric element 750 but also producing flexure of springs 700, 720 and their associated piezoelectric elements 710, 730. Appropriately configured circuitry connected to the three piezoelectric elements may then be employed to harvest energy from the environmentally induced vibrations by collecting charge from the flexure of the three piezoelectric elements 710, 730, 750.

As with previously illustrated embodiments, the embodiment illustrated in FIG. 7 may optionally include capacitor-forming electrodes 810, 820 attached to proof mass 800 and support 770, respectively, as shown. Such electrodes may be employed in a manner similar to that previously described to function in concert with the piezoelectric elements to provide enhance energy harvesting capability. It should be borne in mind that additional techniques including coil and magnet configurations as well as additional piezoelectric elements may be employed in place of capacitor forming elements 810, 820 to assisting in harvesting additional energy from environmentally induced vibrations.

Figure 8:
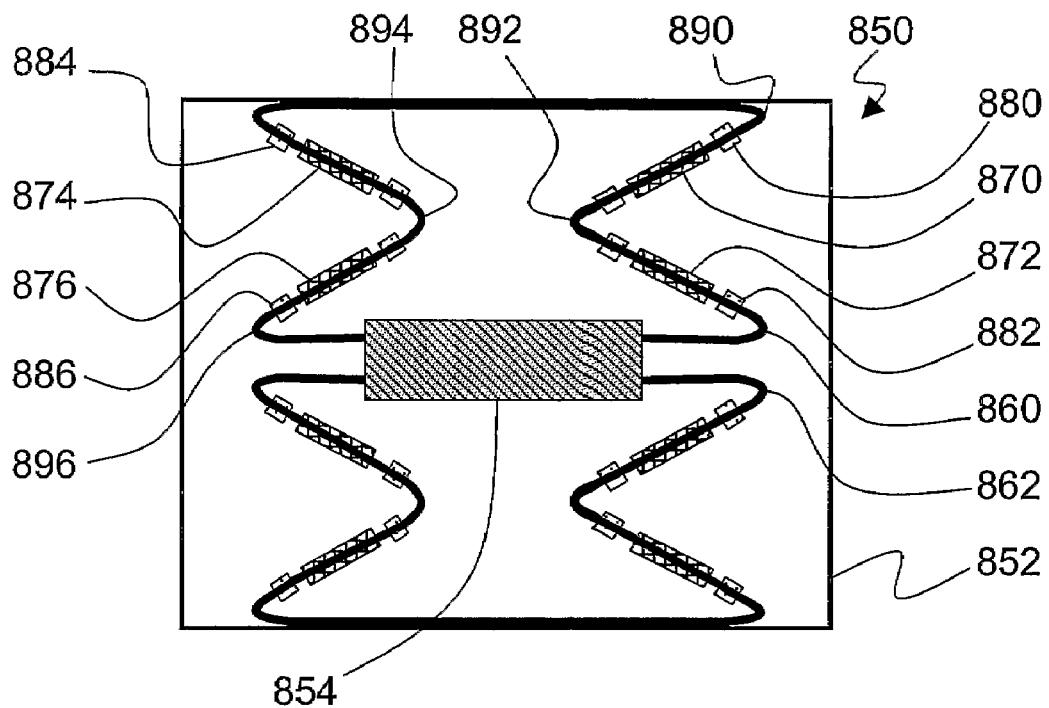
FIG. 8 illustrates an eighth exemplary embodiment of the present technology and a first embodiment employing a constant force spring configuration.

Referring now to FIG. 8, there is illustrated a functional realization of a double acting embodiment of a power generator 850 constructed in accordance with the present subject matter that incorporates the use of a pair of constant force springs 860, 862 to achieve a "balanced opposition" functionality previously described. As shown in FIG. 8, constant force springs 860, 862 are arranged inside a frame 852 and configured in a manner so as to support a proof mass 854 in a central, neutral position within the frame 852.

Figure 16:
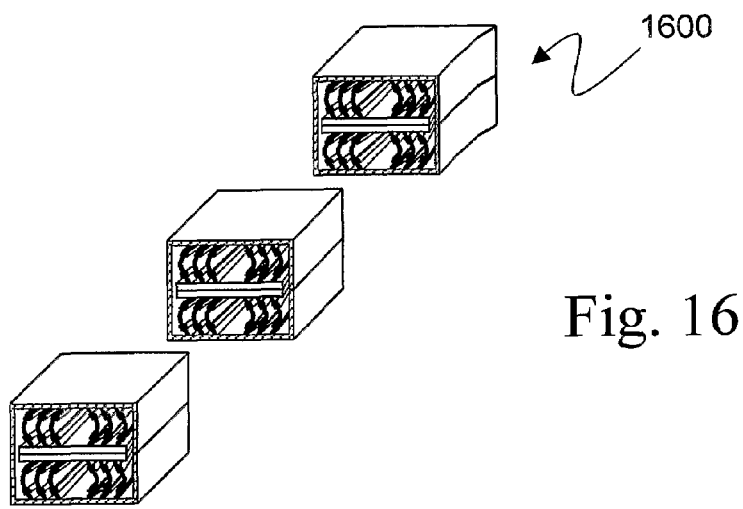

Each of the springs 860, 862 is substantially identical in construction and each has a number of elements mounted thereon as will be explained with numbered reference with respect to spring 860 and which are duplicatively illustrated but not numbered with respect to spring 862 to keep the drawing from becoming excessively cluttered. In addition, it should be appreciated that all of the remaining Figures to be discussed save FIGS. 11(b) and 16 represent an end view of the power generator embodiments being described. The power generators are, of course, three dimensional devices and the springs and other elements described may more accurately be described as sheet-like structures similar to the illustration in FIG. 11(b) as will be described more fully later.

With further reference to FIG. 8, it will be seen that a number of elements have been affixed to springs 860 and 862. These elements include spring stiffening elements 870, 872, 874, 876 and piezoelectric elements 880, 882, 884, 886. Some or all of these elements may constitute dual elements in that physical structures may be placed on both sides of the respective springs 860, 862 at the locations specified for the spring stiffening elements 870, 872, 874, 876 and piezoelectric elements 880, 882, 884, 886. In some instances, piezoelectric elements, per se, may be used as the spring stiffing elements. This construction will be more clearly explained with reference to the sequential steps of manufacture illustrated hereinafter in FIGS. 11(a)-16. Piezoelectric elements 880, 882, 884, 886 are attached to springs 860, 862 as shown and may be oriented with the advantageous piezoelectric field orientation either axially or radially to the center of curvature of the flexure points 890, 892, 896 of the springs 860, 862.

One aspect of realizing an energy-harvesting device or power generator as power generator 850 with the desirable properties that allow it to function as a broad band energy acceptor is the use of an inertial mass 854 that is held between two balanced forces. However, for any practical realization another aspect that must be considered is that there exists sufficient range of displacement for the proof mass. To allow for sufficient displacement of proof mass 854 in the exemplary embodiment illustrated in FIG. 8, springs 860, 862 are constructed as constant force flexures, i.e. springs.

Embodiments of the power generator constructed according to the present subject matter may be constructed using any form of constant force flexures. For example, the exemplary power generator 900 in accordance with the present subject matter illustrated in FIG. 9 may be composed of four groups of sets 902, 904, 906, 908 of three buckled beams configured as opposing pairs of groups of sets. Each buckled beam exemplarily illustrated as beam 910 in set 904 has mounted thereon a pair of piezoelectric elements 912, 914, which, as with the embodiment illustrated in FIG. 8, may correspond to paired piezoelectric elements positioned on either side of the beam 910 in a manner similar to that previously discussed with respect to FIG. 8.

The opposed pairs of sets 902, 904, 906, 908 of buckled beams are positioned inside frame 952 so as to maintain proof mass 954 in a central, neutral position absent externally applied forces. It should be strictly kept in mind that the illustration and description of three element sets is exemplary only and does not correspond to a requirement of the present subject matter. Rather the concept of constant force is the design criteria to be addressed. Constant force systems may be created in accordance with the present subject matter using any reasonably practical number of flexures. Moreover, as illustrated by the dashed outline of the central most piezoelectric elements 912', 914' in each of the opposed pairs of sets 902, 904, 906, 908 of buckled flexures, the provision of a piezoelectric element on either or both sides of each flexure is optional. That is, there may be flexures in sets of flexures that have no piezoelectric devices, unimorphs, or bimorphs attached thereto. All such configurations are contemplated by the present subject matter.

Despite the optional nature of the placement of the piezoelectric elements, one advantage of this embodiment of the present subject matter is that piezoelectric elements 912, 914 may be attached to each flexure. Attaching piezoelectric elements to each flexure results in a much larger number of piezoelectric elements being included in the device as compared to the embodiment illustrated in FIG. 8 and thus an increased energy output may be obtained. In both embodiments, the piezoelectric elements are stressed as the flexures deform, and can be used to harvest energy with much less piezoelectric material than previously required and can do so in a very compact form.

Figure 9:
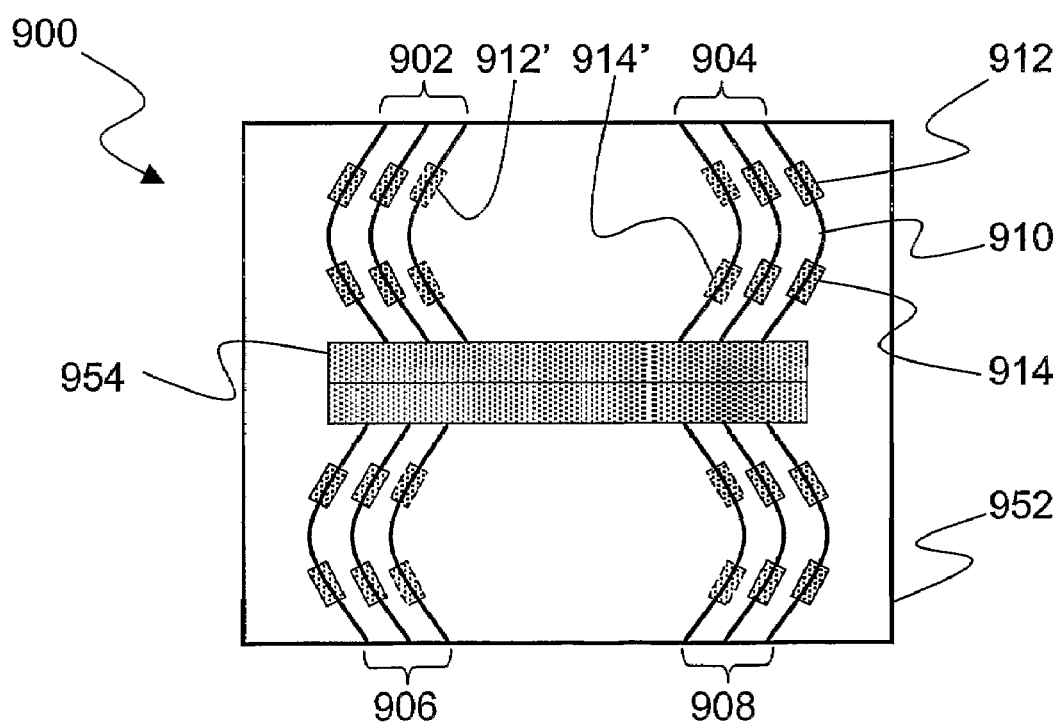
FIG. 9 illustrates a second constant force spring configuration embodiment of the present technology.
Figure 10:
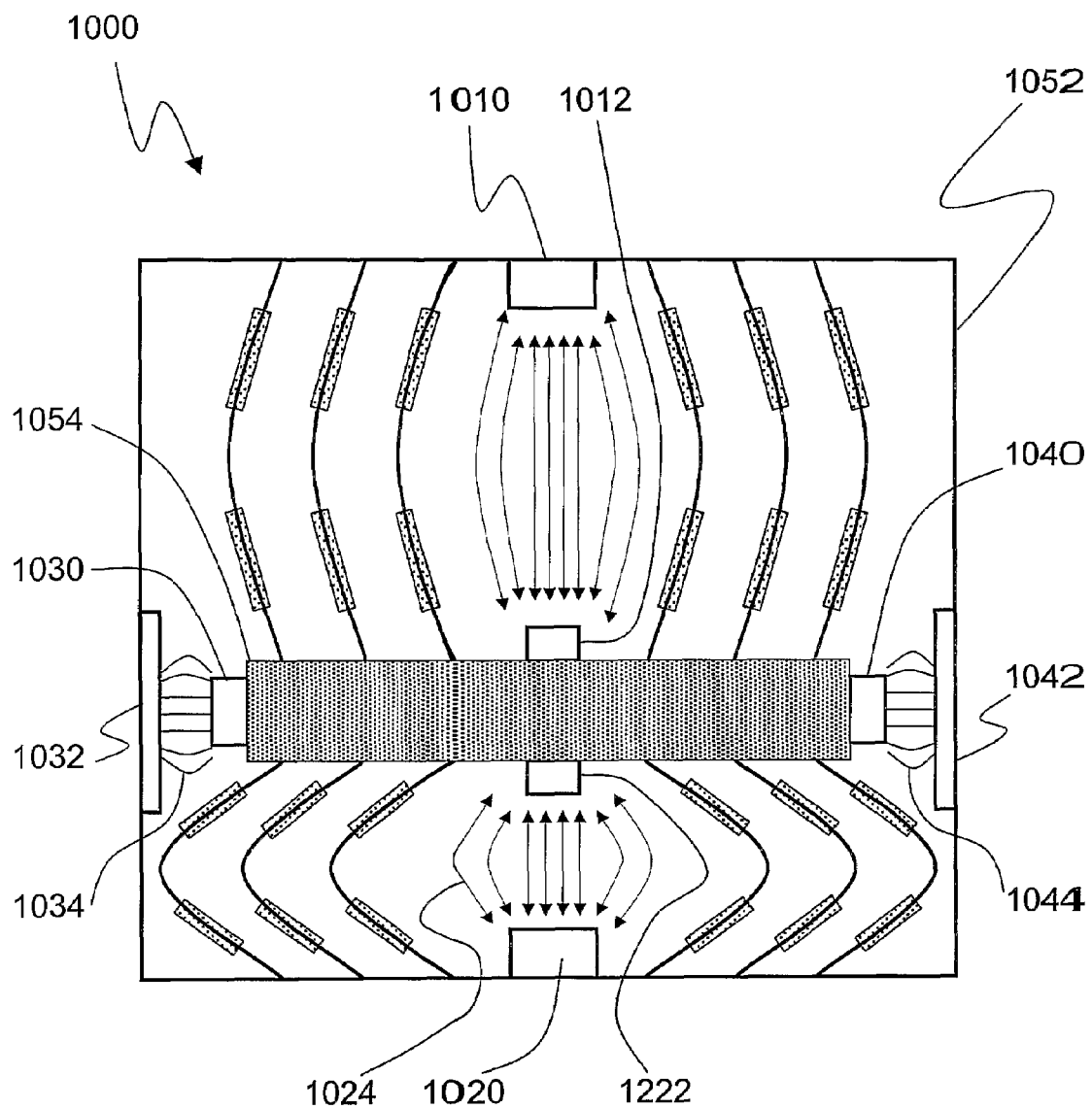
FIG. 10 illustrates an exemplary configuration of the present subject matter and includes an example of motion stop limit means combined with the embodiment illustrated in FIG. 9.

The use of flexures such as those illustrated in FIGS. 8 and 9 can result in very large displacements, and thus there may be a need to provide stop limits to the functional devices so that the device does not become trapped into a locked out, i.e. maximally displaced, position from which the device cannot function. An exemplary configuration of such stop limit devices is illustrated in FIG. 10. The exemplary configuration illustrated in FIG. 10 is substantially identical to that illustrated in FIG. 9 and thus those corresponding components that are the same in both embodiments will not be further described.

An advantageous aspect associated with selected embodiments of the present subject matter is that the stop limit devices provided be of a regenerative nature. Regenerative stop limit device can be used to provide energy conversion between kinetic energy that may be converted to potential energy and back to kinetic energy at the stop. The stop limit elements illustrated in FIG. 10 provide such a regenerative nature in this exemplary embodiment as they correspond to permanent magnet pairs 1010, 1012; 1020, 1022; 1030, 1032; and 1040, 1042 attached at paired locations to the frame 1052 and proof mass 1054 as illustrated in FIG. 10. The permanent magnet pairs are configured such that mutually opposing fields are created to maintain separation among the various top, bottom, and end surfaces of the proof mass 1054 and corresponding locations on the fame 1052. In this case the kinetic energy of the proof mass 1054 is converted to magnetic force potential, is stored in the magnet fields 1024, 1032, 1044, and converted back to kinetic energy in the proof mass 1054 as the reaction force stored in the field returns the proof mass 1054 to an equilibrium position.

It should be strictly borne in mind that other means may be provided that may correspond to an energy conserving stop limit including, but not limited to, a gas spring, another flexure with appropriate characteristics, or any other means well know to those of ordinary skill in the art. In this case, an appropriate characteristic can be described as having negligible affect when distant and rapidly increasing affect when the end of a displacement is reached. For the magnetic case the force increases as $1/r^3$ so that at a relatively far distance, r, there is only a weak affect, but the affect increases rapidly at the terminus of the stop.

A review of FIG. 10 reveals that the device in accordance with the present technology is capable of generating energy by acceleration of the proof mass along two axes. As biaxial energy generation is possible, stop limits may need to be provided in both vertical and horizontal directions. Further, it should be recognized that in all the embodiments of the present subject matter herein presented, deflection of the flexure and thus energy conversion within the device can be accomplished either by fixing the frame to the inertial reference of a vibrating system and allowing the proof mass to react, or by fixing the proof mass to the inertial reference of a vibrating system and allowing the frame to react to vibration. An advantage of the frame moving is that, in principle, it should be possible to achieve a larger reaction mass and therefore a higher lever of energy conversion may be achieved.

With reference now to FIGS. 11(*a*)-16 there is illustrated an exemplary method of fabricating an energy harvester in accordance with the present subject matter. FIG. 11(*a*) illustrates an initial step of the fabrication process as piezoelectric elements 1102, 1104, 1006, and 1008 are attached to flexure 1160 to produce an individual flexure assembly 1100. This flexure assembly 1100 may also correspond to the flexure assembly previously illustrated in FIG. 8. As illustrated in FIG. 11(*a*), piezoelectric elements 1102 and 1104 have already been attached to flexure 1160 while piezoelectric elements 1106 and 1108 are illustrated as in the process of being attached.

It should be appreciated that the devices illustrated in FIGS. 11(*a*), 12(*a*), 12(*b*) and 13-15 represent 2-dimensional, end on, views of the actual devices whereas the flexures may, in fact, correspond to sheets as more readily may be seen in the views illustrated in FIG. 11(*b*) and the final assembled view of FIG. 16. FIG. 11(*b*), in addition to illustrating the sheet-like structure of the flexure assembly 1100 illustrates a fabrication process step where all four piezoelectric elements have been attached to the flexure 1160.

Attachment of the piezoelectric elements to flexure 1160 may be accomplished via any standard means including, but not limited to, adhesives, epoxy, voltage curing, and diffusion bonding. Moreover the formation of necessary electrodes and poling of the piezoelectric material may be accomplished by any available method, such methods being well known to those of ordinary skill in the art. Although such is not a limitation to the present technology, one advantage of this attachment technique is that it allows for the use of higher performance piezoelectric material and inexpensive mass batch production using sheets of both piezoelectric and flexure materials. The flexure materials may correspond to metals, composites or any suitable material that may provide appropriate spring force as herein described.

Referring now to FIG. 12(*a*), the next step in the fabrication process is illustrated. As will be seen, plural flexure assemblies 1100 have been provided and individually attached to a U-shaped frame 1200. The flexure assemblies 1100 may correspond to a sheet of flexure material with attached piezoelectric material that may be cut into strips for attachment to U-shaped frame 1200 via any suitable attachment means. As illustrated in FIG. 11(*a*), attachment of the flexure assemblies 1100 may be in an abutting arrangement with the flexure assemblies being secured boy adhesive, epoxy, welding, or any other suitable method. Alternatively, as illustrated in partial breakout in FIG. 12(*b*) in an area corresponding to the dashed circle portion 1210 illustrated in both FIGS. 12(*a*) and 12(*b*), either the entire sheet or sections 1110 of the sheet corresponding to the flexure assemblies 1100 may be passed through openings in the U-shaped frame and attached by any suitable method including, but not limited to those methods previously mentioned. One advantage of using the attachment method illustrated in FIG. 12(*b*) is that electrical connections to the piezoelectric elements may be made through the frame by way of the same openings through which the flexures pass.

Figure 13:
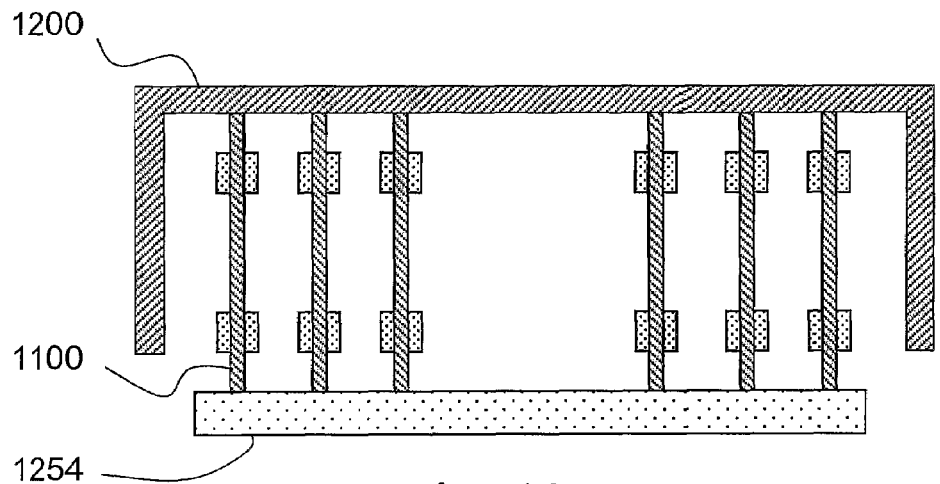

The next step in the fabrication process is the attachment of a proof mass 1254 to the flexure assemblies 1100 as illustrated in FIG. 13. The proof mass 1254 may correspond to a sheet of metal that meets the physical requirements of the device. A non-limiting example of a suitable material for the proof mass 1254 is lead. The proof mass 1254 may be attached to the flexure assemblies using any suitable means including, but not limited to, those attachment methods previously mentioned.

Figure 14:
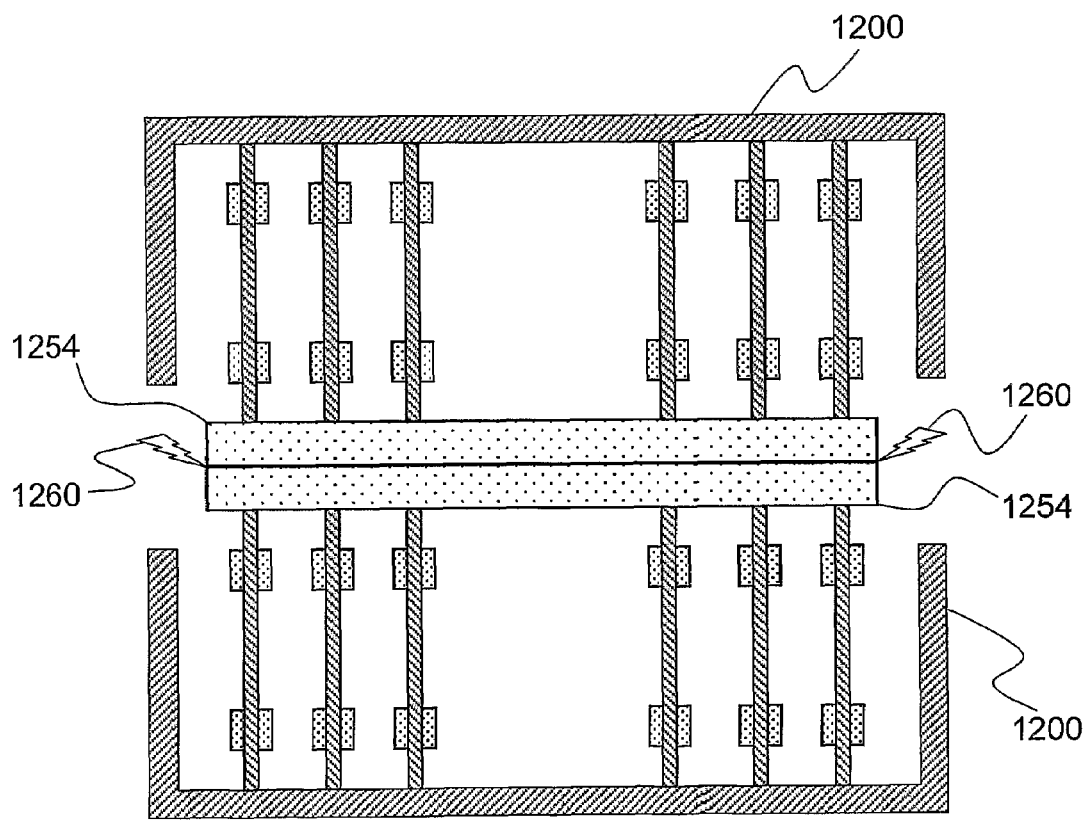

Following attachment of the proof mass 1254, a first half of the energy harvester according to the present subject matter has been completed and the next step in the fabrication process calls for securing together a second such completed half as illustrated in FIG. 14. As shown, two U-shaped frames 1200 with flexure assemblies 1100 and proof masses 1254 attached are coupled together by abutting the two proof masses 1254 and securing them together. The proof masses 1254 may be secured together by any suitable method, for example, welding as representatively illustrated at 1260. Such securing method is not, however, limiting to the present subject matter as any suitable method may be employed including adhesives, epoxy, or even via a suitable mechanical fastener means.

Figure 15:
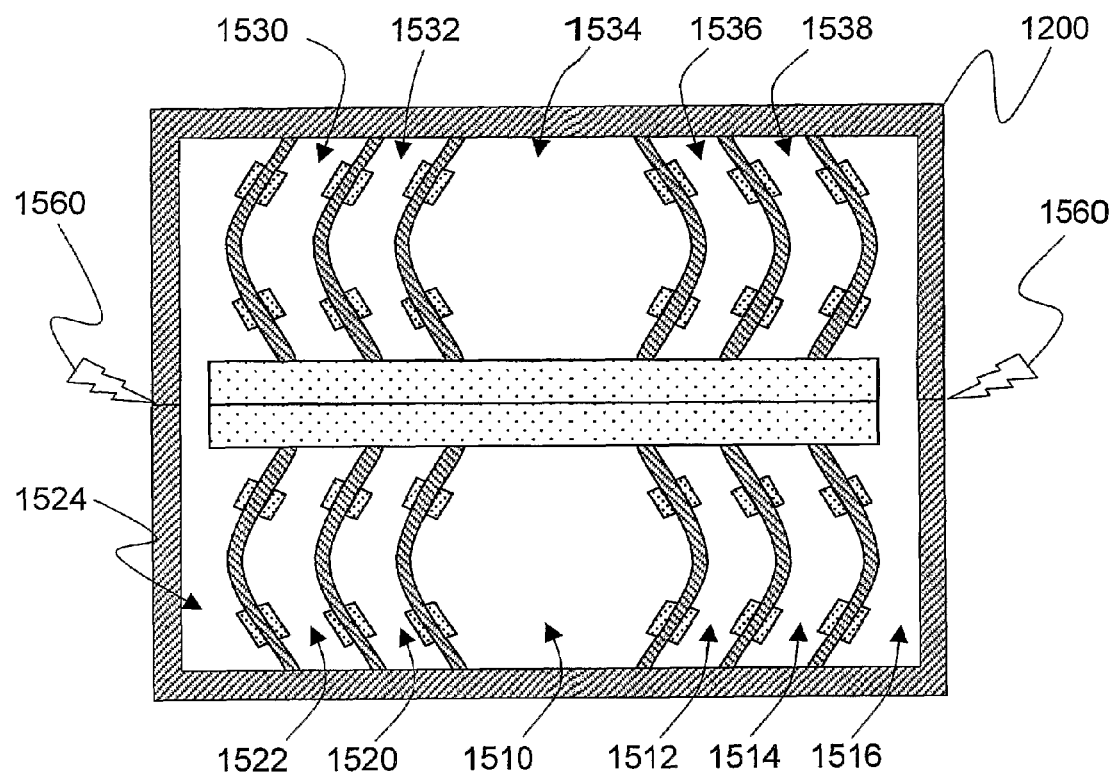

Following securing of the two proof masses 1254, the two U-shaped frames 1200 and assembled flexures and proof masses are placed into compression as illustrated in FIG. 15 and the two U-shaped frames 1200 are secured together. As with the proof masses 1254, the two U-shaped frames 1200 may be secured together by welding as illustrated at 1560 in a manner similar to that that may be employed to secure the proof masses together. Alternatively the two U-shaped frames 1200 may be secured together using any suitable means including any of those previously mentioned above. Regardless of the method used to secure the two U-shaped frames 1200, the frames are secured for the entire length of the frames and on both sides.

Dicing the U-shaped frame and its housed components into individual energy harvesting devices as illustrated in FIG. 16 completes the final steps in the fabrication of the energy harvesters according to the present subject matter. Prior to the dicing step, however, and in order to support and protect the components contained within the joined U-shaped frames during the dicing process, the spaces 1510-1538 between the various assembled components within the channel formed by the joined U-shaped frames are filled with a sacrificial support material. Non-limiting examples of suitable sacrificial support material include polyurethane, PMA, or any other suitable material that may be removed in such a way that the dissolution agent does not affect the mechanical or electrical properties of the device.

Following dicing, the sacrificial material is removed to release the component parts and produce the individual energy harvester 1600 illustrated in FIG. 16. Removal of the sacrificial material could proceed via carbon reduction or dissolution.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An energy harvesting apparatus for harvesting and converting environmentally intrinsic vibrational energy into electrical energy comprising:
    a constant force flexure structure comprising at least one pair of constant force flexures;
    at least one piezoelectric element secured to said constant force flexure structure;
    a support structure securing at least one portion of said constant force flexure structure from relative motion along at least one axis;
    at least one proof mass coupled to a second portion of said constant force flexure structure; and
    at least one regenerative motion stop means wherein the motion stop means is configured to limit relative movement between the at least one proof mass and the support structure in at least one axial direction;
    whereby environmentally intrinsic vibrational energy produces relative movement between the at least one proof mass and the support structure and consequent movement of the constant force flexure structure thereby producing electrical energy by said at least one piezoelectric element.

2. An energy harvesting apparatus as in claim 1, wherein each of the flexures of the at least one pair of constant force flexures are arranged in balanced opposition to each other.

3. An energy harvesting apparatus as in claim 1, wherein said at least one proof mass is coupled to each of the flexures of the pair of constant force flexures.

4. An energy harvesting apparatus as in claim 1, wherein said at least one regenerative motion stop means comprises at least one pair of magnets.

5. An energy harvesting apparatus as in claim 1, further comprising:
    at least two regenerative motion stop means wherein the motion stop means are configured to limit relative movement between the proof mass and the support structure in at least two axial directions.

6. An energy harvesting apparatus as in claim 5, wherein said at least two regenerative motion stop means comprises at least two pairs of magnets.

7. An energy harvesting apparatus as in claim 2, wherein a plurality of pairs of constant force flexures are arranged in balanced opposition to each other and at least one pair of piezoelectric elements are secured to at least one pair of the constant force flexures.

8. An energy harvesting apparatus as in claim 7, wherein a plurality of pairs of piezoelectric elements are secured to at least one of the constant force flexures and wherein each piezoelectric element of each of the plurality of pairs of piezoelectric elements is secured to opposite sides of at least one of said constant force flexures.

9. An energy harvesting apparatus as in claim 1,
    wherein said at least one proof mass is longitudinally extending;
    wherein said support structure comprises a frame surrounding said constant force flexure structure and said at least one proof mass; and
    wherein a first portion of each constant force flexure is secured to opposite sides of said at least one proof mass and a second end of each constant force flexure is secured to said support structure.

10. An energy harvesting apparatus as in claim 1, wherein said constant force flexure structure comprises a plurality of constant force flexures, at least one of the constant force flexures supporting at least one piezoelectric element.

11. An energy harvesting apparatus as in claim 10, wherein each of the plurality of constant force flexures each support a plurality of piezoelectric elements.

12. An energy harvesting apparatus as in claim 11, wherein the plurality of piezoelectric elements are arranged in pairs on opposite sides of the constant force flexures to which they are attached.

13. An energy harvesting apparatus as in claim 12, further comprising at least two regenerative motion stop means coupled to said at least one proof mass and said support structure, wherein the motion stop means is configured to limit relative movement between the at least one proof mass and the support structure in at least two axial directions.

14. An energy harvesting apparatus as in claim 13, wherein said motion stop means comprises at least two pairs of magnets.

\* \* \* \* \*